(12) United States Patent
Ogihara et al.

(10) Patent No.: US 7,868,407 B2
(45) Date of Patent: Jan. 11, 2011

(54) SUBSTRATE COMPRISING A LOWER SILICONE RESIN FILM AND AN UPPER SILICONE RESIN FILM

(75) Inventors: Tsutomu Ogihara, Niigata (JP); Takafumi Ueda, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 688 days.

(21) Appl. No.: 11/598,749

(22) Filed: Nov. 14, 2006

(65) Prior Publication Data

US 2007/0128886 A1   Jun. 7, 2007

(30) Foreign Application Priority Data

Dec. 2, 2005 (JP) .............................. 2005-349671

(51) Int. Cl.
*H01L 33/44* (2010.01)
(52) U.S. Cl. .......................... 257/437; 438/72; 438/636
(58) Field of Classification Search ................. 257/437, 257/E21.029; 438/72, 636, 952; 428/149, 428/147
See application file for complete search history.

(56) References Cited

U.S. PATENT DOCUMENTS

| 5,926,740 | A | 7/1999 | Forbes et al. | |
| 2002/0033661 | A1* | 3/2002 | Sugimachi et al. | 313/479 |
| 2004/0014322 | A1 | 1/2004 | Hwang et al. | |
| 2004/0253461 | A1* | 12/2004 | Ogihara et al. | 428/447 |

FOREIGN PATENT DOCUMENTS

| DE | 103 00 765 A1 | 2/2004 |
| EP | 1 039 347 A1 | 9/2000 |
| JP | A-07-183194 | 7/1995 |
| JP | A-2005-015779 | 1/2005 |

OTHER PUBLICATIONS

Wikipedia, "silicone" Dec. 30, 2003, http://web.archive.org/web/20040111093510/http://en.wikipedia.org/wiki/silicone.*
K. Linliu et al., "A Novel Dual Layer Polymeric Anti-Reflective Coating (PARC) for Sub-0.18 μm KrF Lithography", Proceedings of SPIE, vol. 4000, (2000) pp. 982-993.

* cited by examiner

*Primary Examiner*—Marcos D. Pizarro
*Assistant Examiner*—Eva Yan Montalvo
(74) *Attorney, Agent, or Firm*—Oliff & Berridge, PLC

(57) ABSTRACT

There is disclosed a substrate comprising at least an organic film, an antireflection silicone resin film over the organic film, and a photoresist film over the antireflection silicone resin film, wherein the antireflection silicone resin film includes a lower silicone resin film and an upper silicone resin film which has lower silicon content than the lower silicone resin film. There can be provided a substrate comprising at least an organic film, an antireflection silicone resin film over the organic film, and a photoresist film over the antireflection silicone resin film, in which the antireflection silicone resin film has both excellent resist compatibility and high etching resistance at the time of etching the organic film, whereby a pattern can be formed with higher precision.

8 Claims, 3 Drawing Sheets

(a)

(b)

(c)

(d)

(e)

F I G. 3
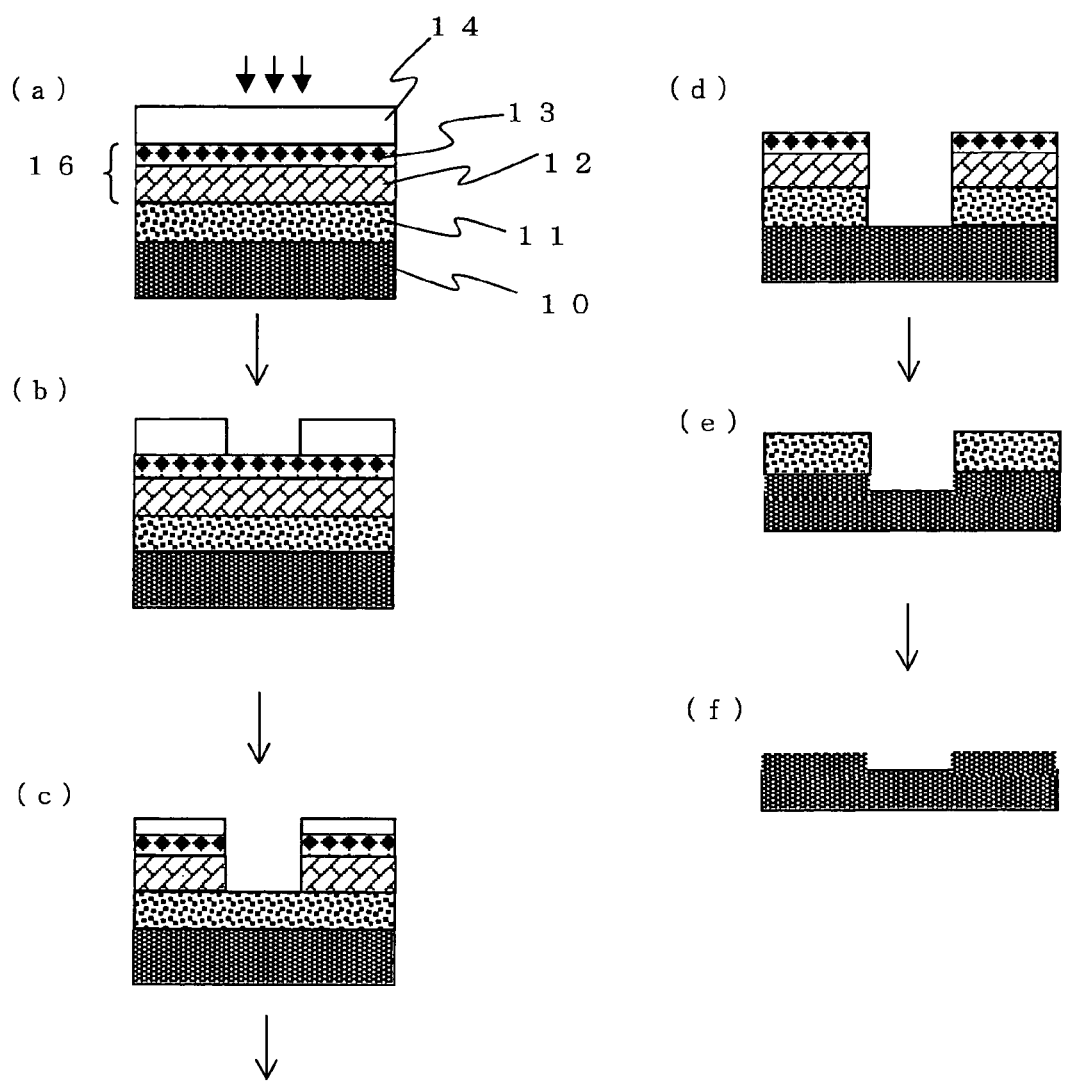

SUBSTRATE COMPRISING A LOWER SILICONE RESIN FILM AND AN UPPER SILICONE RESIN FILM

BACKGROUND OF THE INVENTION

1. Field of the Invention

The present invention relates to microprocessing in manufacturing process of semiconductor devices etc., and more particularly, to a multilayer resist method that enables finer patterning with a thin photoresist film by using a high energy beam such as KrF excimer laser light (248 nm), ArF excimer laser light (193 nm), $F_2$ laser light (157 nm), electron beam or X-ray as an exposure light source. More specifically, the present invention relates to a substrate for the multilayer resist method comprising at least an organic film, an antireflection silicone resin film over the organic film, and a photoresist film over the antireflection silicone resin film, a method for producing the substrate, and a patterning process with the substrate.

2. Description of the Related Art

As higher integration and higher speed of LSI are realized, finer pattern size is achieved rapidly. Along with the achievement of finer pattern size, the lithography techniques have accomplished micropatterning by using light sources with shorter wavelength and properly selecting photoresist film compositions corresponding to the light sources. As for such compositions, positive photoresist film compositions used as a monolayer are mainly selected. Each of these monolayer positive photoresist film compositions has a structure with etching resistance against etching with chlorine-containing-gas plasma or fluorine-containing-gas plasma in the resin of the composition, and has resist mechanism that an exposed area turns soluble. Such a photoresist film composition is applied to a substrate, and a resist pattern is formed on the photoresist film by dissolving an exposed area. Then the substrate is etched by using the photoresist film on which the resist pattern is formed as an etching mask.

However, when a pattern is rendered finer, that is, a pattern width is narrowed, without changing the thickness of a photoresist film to be used, resolution of the photoresist film is deteriorated. And developing the pattern on the photoresist film with a developer causes pattern collapse because the so-called aspect ratio of the pattern becomes too high. Therefore, the thickness of a photoresist film has been thinner along with achieving a finer pattern.

On the other hand, the use of shorter wavelength exposure radiations requires resins with low absorbance at the wavelength to be used for photoresist film compositions. Accordingly, as the radiation shifts from i-line to KrF and to ArF, the resin shifts from novolac resins to polyhydroxystyrene, and to acrylic resins. Along with this shift, an etching rate of a resin actually becomes high under the etching conditions mentioned above.

As a result, a substrate has to be etched with a thinner resist film having lower etching resistance. The need to provide a photoresist film with high etching resistance has become urgent.

On the other hand, a bilayer resist method, which is one of the so-called multilayer resist method, has been developed so far. In the bilayer resist method, a photoresist film and a lower film are used. The photoresist film on which a fine pattern can be formed has low etching resistance under etching conditions for processing a substrate. The lower film has enough etching resistance for processing a substrate, and can be patterned under conditions that the photoresist film exhibits resistance. In the bilayer resist method, a resist pattern is temporarily transferred to the lower film, and then the substrate for processing is etched by using the pattern-transferred lower film as an etching mask. In a representative example of the method, a silicon-containing resin is used for the photoresist film, and an aromatic resin is used for the lower film. In this method, a resist pattern is formed on a photoresist film including a silicon-containing resin. Then conducting oxygen reactive ion etching turns the silicon-containing resin into silicon oxide which has high etching resistance against oxygen plasma, and removes portions of the aromatic resin that is not covered by the silicon oxide serving as an etching mask, whereby the resist pattern on the silicon-containing resin is transferred to the lower film including the aromatic resin. Because optical transparency is not required at all as distinct from monolayer resist films, various resins with high etching resistance against etching with fluoride gas plasma or chloride gas plasma can be used as the aromatic resin. Then a substrate is etched with fluoride gas plasma or chloride gas plasma by using the lower film including the aromatic resin as an etching mask.

Besides the bilayer resist method, a trilayer resist method that can be conducted by using general photoresist film compositions used for the monolayer resist method is also known. In the trilayer resist method, in general, an organic film, a silicon-containing intermediate film thereon, and a photoresist film on the intermediate film are formed. The organic film includes an aromatic resin that is used as a lower film in the bilayer resist method and that has sufficiently higher etching resistance than a substrate.

In order to pattern the trilayer, firstly, a resist pattern is formed on the photoresist film by lithography. Secondly, the silicon-containing intermediate film is patterned with fluoride gas plasma by using the photoresist film as an etching mask. Use of fluoride gas plasma allows for large etching selection ratio between the photoresist film and the silicon-containing intermediate film. Thirdly, oxygen reactive ion etching is conducted to thus-obtained pattern, whereby the organic film including an aromatic resin on the substrate is etched by using the patterned silicon-containing intermediate film as an etching mask. In this way, in the trilayer resist method, combining etching conditions enables forming an etching mask pattern over a substrate that has sufficiently high etching resistance when the substrate is processed.

The silicon-containing intermediate film used for the trilayer resist method is broadly divided into organic silicon-containing films made of organic silicon-containing film compositions such as SOG films or antireflection silicone resin films; and inorganic silicon-containing films formed by the plasma CVD method etc. such as silicon oxide films, silicon nitride films, or silicon oxide nitride films.

As for the inorganic silicon-containing films, use of the high density plasma CVD method provides dense inorganic silicon-containing films. It is recognized that such films show excellent ion impact resistance, do not cause film loss or contraction, and provide organic film patterns faithful to design rules when an organic film which serves as an underlying layer of an intermediate film is subjected to dry etching (See Japanese Unexamined Patent Application Publication No. H07-183194). However, this case requires introduction of an expensive CVD apparatus and a wide area for installing the apparatus. Therefore, the case costs much and which is a problem.

Then organic silicon-containing films become a focus of attention because the films can be formed by spin-coating method etc. and do not require any extra apparatus such as a CVD apparatus. Among the organic films, antireflection silicone resin films particularly receive attention and have been developed because the antireflection films has a function to reduce reflection optically and have excellent preservation stability (See Japanese Unexamined Patent Application Publication No. 2005-15779).

In order to form a pattern with higher precision on a substrate, the following intermediate films are required: films that can maintain excellently resist pattern profile formed on an overlying photoresist film, that is, that show excellent resist compatibility; and that also show high etching resistance at the time of etching an underlying organic film. Up to now, there is no antireflection silicone resin film that has both excellent resist compatibility and high etching resistance at the time of etching an organic film. And the development of such a film has been awaited.

SUMMARY OF THE INVENTION

The present invention has been accomplished to solve the above-mentioned problems, and an object of the present invention is to provide a substrate comprising at least an organic film, an antireflection silicone resin film over the organic film, and a photoresist film over the antireflection silicone resin film, in which the antireflection silicone resin film has both excellent resist compatibility and high etching resistance at the time of etching the organic film, whereby a pattern can be formed with higher precision on the substrate; and a method for producing such a substrate.

In order to achieve the above object, the present invention provides a substrate comprising at least an organic film, an antireflection silicone resin film over the organic film, and a photoresist film over the antireflection silicone resin film, wherein the antireflection silicone resin film includes a lower silicone resin film and an upper silicone resin film which has lower silicon content than the lower silicone resin film.

As described above, when the antireflection silicone resin film includes a lower silicone resin film and an upper silicone resin film which has lower silicon content than the lower silicone resin film, the lower film has higher etching resistance at the time of etching the organic film than the upper film, while the upper film has higher resist compatibility than the lower film. Consequently, using a substrate with such an antireflection silicone resin film enables patterning the substrate with higher precision than patterning a conventional substrate with a monolayer antireflection silicone resin film.

In the substrate according to the present invention, it is preferable that the lower silicone resin film has a silicon content of 30 mass % or more.

And in the substrate according to the present invention, it is preferable that the lower silicone resin film has a carbon content of 29 mass % or less, and the upper silicone resin film has higher carbon content than the lower silicone resin film.

As described above, when the lower silicone resin film has a silicon content of 30 mass % or more, or when the lower silicone resin film has a carbon content of 29 mass % or less, the lower silicone resin film has sufficiently high etching resistance at the time of etching the organic film. Consequently, a pattern can be transferred to the organic film with higher precision.

In the substrate according to the present invention, it is preferable that the upper silicone resin film has lower silicon content than the lower silicone resin film, and the upper silicone resin film has a silicon content of less than 35 mass %.

As described above, when the upper silicone resin film has lower silicon content than the lower silicone resin film, and the upper silicone resin film has a silicon content of less than 35 mass %, preferably less than 30 mass %, the upper film has sufficiently high resist compatibility.

Furthermore, the present invention provides a method for producing a substrate comprising at least an organic film, an antireflection silicone resin film over the organic film, and a photoresist film over the antireflection silicone resin film, comprising: at least, forming the organic film over the substrate;

forming a lower silicone resin film over the organic film, and forming an upper silicone resin film which has lower silicon content than the lower silicone resin film over the lower silicone resin film, to form an antireflection silicone resin film including the lower silicone resin film and the upper silicone resin film; and forming a photoresist film over the antireflection silicone resin film.

In thus-produced substrate, the antireflection silicone resin film includes the lower silicone resin film and the upper silicone resin film, and the upper film has lower silicon content than the lower film. In such an antireflection silicone resin film, the lower film has higher etching resistance at the time of etching the organic film than the upper film, while the upper film has higher resist compatibility and preservation stability than the lower film. Consequently, using such a substrate enables patterning the substrate with higher precision than patterning a conventional substrate with a monolayer antireflection silicone resin film.

In the method for producing a substrate according to the present invention, it is preferable that the lower silicone resin film has a silicon content of 30 mass % or more.

And in the method for producing a substrate according to the present invention, it is preferable that the lower silicone resin film has a carbon content of 29 mass % or less, and the upper silicone resin film has higher carbon content than the lower silicone resin film.

As described above, when the lower silicone resin film has a silicon content of 30 mass % or more, or when the lower silicone resin film has a carbon content of 29 mass % or less, the lower silicone resin film has sufficiently high etching resistance at the time of etching the organic film. Consequently, a pattern can be transferred to the organic film with higher precision.

In addition, in the method for producing a substrate according to the present invention, it is preferable that the upper silicone resin film has lower silicon content than the lower silicone resin film, and the upper silicone resin film has a silicon content of less than 35 mass %.

As described above, when the upper silicone resin film has lower silicon content than the lower silicone resin film, and the upper silicone resin film has a silicon content of less than 35 mass %, more preferably less than 30 mass %, the upper film has sufficiently high resist compatibility.

Furthermore, the present invention provides a patterning process for a substrate comprising: at least, preparing the substrate according to the present invention;

forming a resist pattern on the photoresist film over the substrate;

forming a pattern on the antireflection silicone resin film by using the photoresist film on which the resist pattern is formed as a mask;

forming a pattern on the organic film by using the patterned antireflection silicone resin film as a mask; and forming a pattern on the substrate by using the patterned organic film as a mask.

The present invention also provides a patterning process for a substrate comprising: at least, producing a substrate comprising at least an organic film, an antireflection silicone resin film over the organic film, and a photoresist film over the antireflection silicone resin film, by the method for producing a substrate according to the present invention;

subsequently forming a resist pattern on the photoresist film;

forming a pattern on the antireflection silicone resin film by using the photoresist film on which the resist pattern is formed as a mask;

forming a pattern on the organic film by using the patterned antireflection silicone resin film as a mask; and forming a pattern on the substrate by using the patterned organic film as a mask.

By using the processes, the substrate can be patterned with higher precision than patterning a conventional substrate with a monolayer antireflection silicone resin film.

As described above, according to the present invention, an antireflection silicone resin film includes a lower silicone resin film and an upper silicone resin film which has lower silicon content than the lower silicone resin film. Therefore, the lower film has higher etching resistance at the time of etching an organic film than the upper film, while the upper film has higher resist compatibility than the lower film. Consequently, using a substrate with such an antireflection silicone resin film enables patterning the substrate with higher precision than patterning a conventional substrate with a monolayer antireflection silicone resin film.

BRIEF DESCRIPTION OF THE DRAWINGS

FIG. 3 is an explanatory view of one embodiment of a patterning process according to the present invention.

DESCRIPTION OF THE INVENTION AND A PREFERRED EMBODIMENT

A more thorough disclosure of the present invention is presented in the detailed description which follows.

As mentioned above, up to now, there is no an antireflection silicone resin film functioning as an intermediate film that has both excellent resist compatibility and high etching resistance at the time of etching an organic film. And the development of such a silicone resin film has been awaited.

The present inventors have investigated thoroughly to find the following: In order to achieve both excellent resist compatibility and high etching resistance at the time of etching an organic film, an antireflection silicone resin film includes two layers of an upper silicone resin film and a lower silicone resin film, the upper silicone resin film has excellent resist compatibility, and the lower silicone resin film has high etching resistance at the time of etching an organic film. That is, the present inventors have found the following: When the antireflection silicone resin film includes a lower silicone resin film and an upper silicone resin film which has lower silicon content than the lower silicone resin film, the lower film has higher etching resistance at the time of etching an organic film than the upper film, while the upper film has higher resist compatibility than the lower film. Consequently, a substrate with such an antireflection silicone resin film can be patterned with higher precision than a conventional substrate with a monolayer antireflection silicone resin film. Thus, they have accomplished the present invention.

Incidentally, conceivable bilayer intermediate films other than the above film may include:

1. a film in which an antireflection film without silicon is formed on an inorganic silicon-containing film formed by the CVD method;

2. a film in which an antireflection silicone resin film is formed on an inorganic silicon-containing film formed by the CVD method; and 3. a film in which an antireflection film without silicon is formed on an SOG film.

However, forming inorganic silicon-containing films by the CVD method costs much and which is a problem. There is also a problem that the antireflection film without silicon puts a heavy etching-load on an overlying photoresist film at the time of etching the antireflection film. In addition, the SOG film also has a problem of poor preservation stability.

Figure 1:
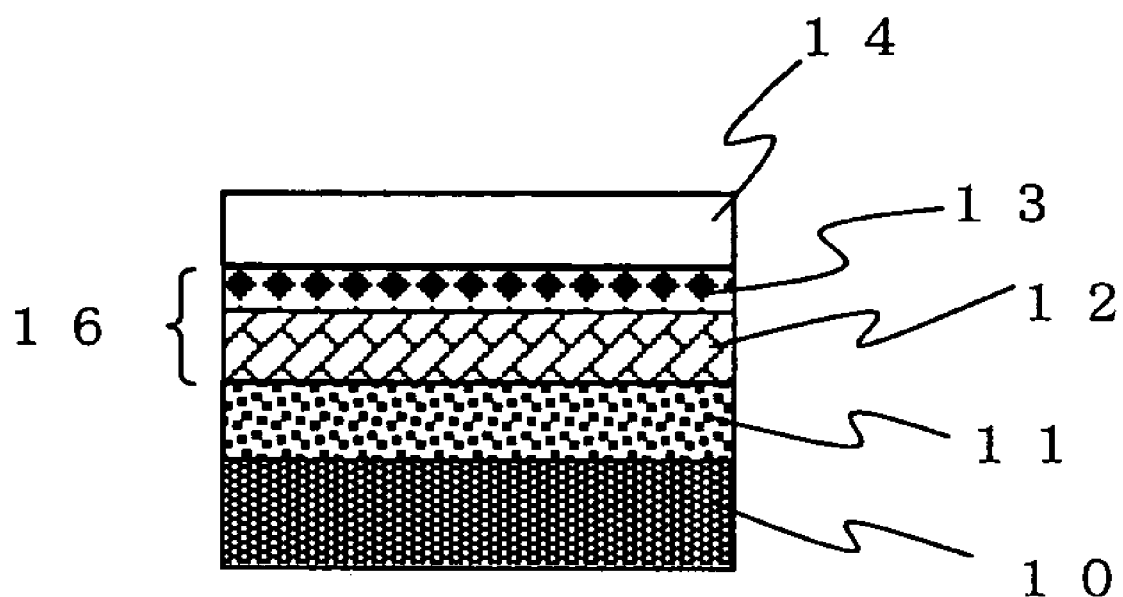
FIG. 1 is a schematic section view of one embodiment of a substrate comprising at least an organic film, an antireflection silicone resin film over the organic film, and a photoresist film over the antireflection silicone resin film according to the present invention.

FIG. 1 is a schematic section view of one embodiment of a substrate comprising at least an organic film, an antireflection silicone resin film over the organic film, and a photoresist film over the antireflection silicone resin film according to the present invention.

A substrate 10 has an organic film 11, an antireflection silicone resin film 16 on the film 11, and a photoresist film 14 on the film 16. And the antireflection silicone resin film 16 includes a lower silicone resin film 12 and an upper silicone resin film 13 which has lower silicon content than the lower silicone resin film 12.

In this way, when the antireflection silicone resin film includes the lower silicone resin film and the upper silicone resin film which has lower silicon content than the lower silicone resin film, the lower film has higher etching resistance at the time of etching the organic film than the upper film, while the upper film has higher resist compatibility than the lower film. Consequently, using a substrate with such an antireflection silicone resin film enables patterning the substrate with higher precision than patterning a conventional substrate with a monolayer antireflection silicone resin film.

In order to impart higher etching resistance at the time of etching the organic film to the lower silicone resin film 12, the film 12 preferably has a silicon content of 30 mass % or more. More preferably, the lower silicone resin film 12 has a silicon content of 30 to 46 mass %. In addition, it is preferable that the lower silicone resin film 12 has a carbon content of 29 mass % or less, and the upper silicone resin film 13 has higher carbon content than the lower silicone resin film 12. More preferably, the lower silicone resin film 12 has a carbon content of 0 to 27 mass %.

In order to impart higher resist compatibility to the upper silicone resin film 13, the upper silicone resin film 13 preferably has lower silicon content than the lower silicone resin film 12, and the upper silicone resin film 13 has a silicon content of less than 35 mass %; more preferably, less than 30 mass %; even more preferably, 10 mass % or more to less than 30 mass %; and most preferably, 12 mass % or more to less than 30 mass %. Incidentally, the upper silicone resin film 13 with the above silicon content preferably has a carbon content of 30 to 70 mass %.

The silicone resin film 12 and 13 can be tailored to have desired silicon content and carbon content, for example, by changing types (types of monomers to be polymerized), combination, polymerization ratio, and so on of the silicone resins. That is, polymerizing a large amount of monomers with high silicon content and low carbon content provides a silicone resin with high silicon content and low carbon content. Conversely, polymerizing a large amount of monomers with low silicon content and high carbon content provides a silicone resin with low silicon content and high carbon content. Furthermore, because silicon content and carbon content of monomers to be polymerized can be obtained accurately in advance, determining types, combination, polymerization ratio, and so on of monomers to be polymerized based on the obtained silicon content and carbon content enables accurate control of silicon content and carbon content of a silicone resin to be obtained.

An example to control silicon content and carbon content of a silicone resin will be explained by referring to a silicone resin obtained by hydrolytic condensation of the following monomers.

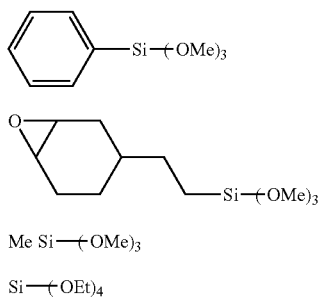

(In the formulae, Me represents a methyl group, and Et represents an ethyl group.)

Among the Monomers, complete hydrolysate of Monomer 1 has a silicon content of 22 mass % and a carbon content of 56 mass %. Complete hydrolysate of Monomer 2 has a silicon content of 15 mass % and a carbon content of 54 mass %. Complete hydrolysate of Monomer 3 has a silicon content of 41 mass % and a carbon content of 18 mass %. Complete hydrolysate of Monomer 4 has a silicon content of 46 mass % and a carbon content of 0 mass %. Incidentally, the remainder of the Monomers is oxygen or hydrogen. As shown above, in general, a monomer with high silicon content has low carbon content, and a monomer with high carbon content has low silicon content.

Determining types and compounding ratio of monomers to be subjected to hydrolytic condensation based on the carbon content and silicon content of the monomers enables accurate control of silicon content and carbon content of a silicone resin as mentioned below.

For example, in order to obtain a silicone resin with a silicon content of 17 mass % and a carbon content of 54 mass %, 20 mole % of Monomer 1 and 80 mole % of Monomer 2 are polymerized.

And, in order to obtain a silicone resin with a silicon content of 24 mass % and a carbon content of 40 mass %, 10 mole % of Monomer 1, 45 mole % of Monomer 2, and 45 mole % of Monomer 4 are polymerized.

And, in order to obtain a silicone resin with a silicon content of 32 mass % and a carbon content of 32 mass %, 10 mole % of Monomer 1, 12 mole % of Monomer 2, and 78 mole % of Monomer 3 are polymerized.

The substrate mentioned above can be produced, for example, by the method for producing a substrate in FIG. 2 as explained below.

Figure 2:
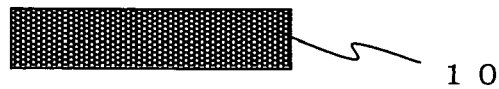
FIG. 2 is an explanatory view of one embodiment of a method for producing a substrate according to the present invention.
Figure 2:
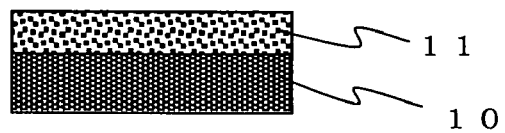
Figure 2:
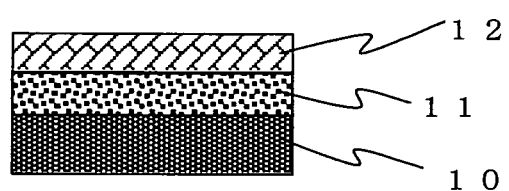
Figure 2:
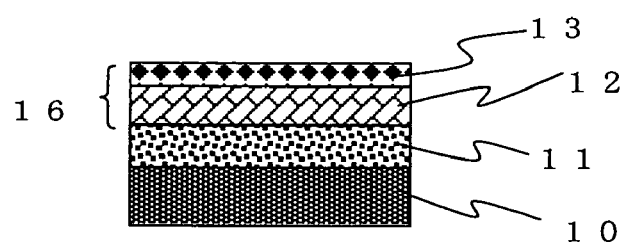
Figure 2:
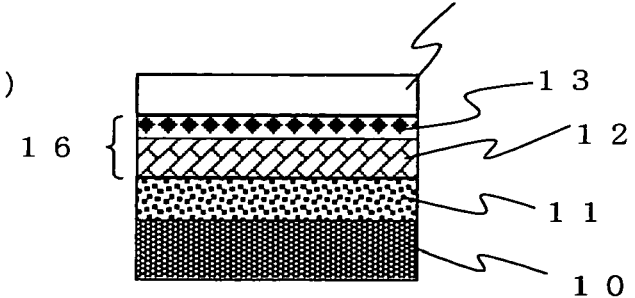

First, as shown in FIG. 2 (a), a substrate 10 to be patterned is prepared.

Second, as shown in FIG. 2 (b), an organic film 11 is formed on the substrate 10.

The organic film 11 can be formed on the substrate 10 by the spin-coating method or the like. After the organic film is applied by spin-coating etc., the organic film is desirably crosslinked with heat or acid. Because the organic film functions as a mask when the substrate 10 is etched. Therefore, it is desirable that the organic film has high etching resistance, and it is required that the organic film does not mix with an overlying lower silicone resin film 12.

Third, as shown in FIG. 2 (c), the lower silicone resin film 12 is formed on the organic film 11.

Fourth, as shown in FIG. 2 (d), an upper silicone resin film 13 is formed on the lower silicone resin film 12. The upper silicone resin film 13 has lower silicon content than the lower silicone resin film 12.

In this way, an antireflection silicone resin film 16 including the lower silicone resin film 12 and the upper silicone resin film 13 is formed.

The lower silicone resin film 12 and the upper silicone resin film 13 can also be formed as with the organic film 11, by applying film composition to the organic film 11 by the spin-coating method or the like. After applying the film composition by the spin-coating or the like, it is desirable to evaporate organic solvent and to bake the film composition to promote crosslinking reactions in order to prevent the film composition from mixing with an overlying photoresist film 14. A baking temperature is preferably in the range of 80 to 300° C., and baking time is preferably in the range of 10 to 300 seconds.

Then as shown in FIG. 2 (e), the photoresist film 14 is formed on the antireflection silicone resin film 16.

The photoresist film 14 can be preferably formed by the spin-coating method, as with the organic film 11 and so on. After photoresist film composition is applied by the spin-coating method or the like, pre-bake is preferably conducted. Preferred pre-bake conditions are temperature in the range of 80 to 180° C., and time in the range of 10 to 300 seconds.

After conducting the steps mentioned above, the substrate in FIG. 1 with the organic film 11, the antireflection silicone resin film 16 on the organic film 11, and the photoresist film 14 on the antireflection film 16 can be produced.

As for the lower silicone resin film and the upper silicone resin film, a film having cross-links between side chains of the silicone resin, between a side chain and a silanol group of the silicone resin, or both between side chains of the silicone resin and between a side chain and a silanol group of the silicone resin can be used.

In this case, it is preferable that the lower silicone resin film and the upper silicone resin film each has cross-links formed by any one or more of a crosslinkable hydroxy group and a crosslinkable epoxy group in a side chain of the silicone resin. Such a silicone resin has particularly excellent preservation stability.

Such a silicone resin can be obtained, for example, by carrying out hydrolysis and condensation of one kind or a mixture of two or more kinds of silicon-containing compounds represented by the following general formula (1).

(In the formula, $R^{1a}$ is an organic group having at least one bond of a carbon-oxygen single bond and a carbon-oxygen double bond; $R^2$ is a monovalent organic group having a light absorbing group; X represents the same or different substituents selected from the group consisting of a halogen atom, a hydrogen atom, a hydroxy group, an alkoxy group having 1-6 carbon atoms, and an alkylcarbonyloxy group having 1-6 carbon atoms. Each of m and n represents an integer of 0 to 3 and satisfies the relationship of $0<(4-m-n)\leq 4$.)

Mass-average molecular weight (relative to polystyrene standard) of a silicone resin obtained from silicon-containing compound(s) represented by the general formula (1) measured by gel permeation chromatography (GPC) is preferably 500 to 1,000,000, more preferably 1,000 to 500,000.

The organic group having at least one bond of a carbon-oxygen single bond and a carbon-oxygen double bond in the general formula (1) has preferably 2 to 30 carbon atoms, more preferably the organic group is one or more organic group(s) selected from a group consisting of an epoxy group, an ester group, an alkoxy group, and a hydroxy group. The organic group means a group containing carbon, and may further contain hydrogen, nitrogen, sulfur, and so on. An example of the organic group having at least one bond of a carbon-oxygen single bond and a carbon-oxygen double bond in the general formula (1) is as follows.

$$(P-Q_1-(S_1)_{v1}-Q_2)_u-(T)_{v2}-Q_3-(S_2)_{v3}-Q_4-$$

(In the formula, P represents a hydrogen atom, a hydroxy group, an epoxy ring ($OCH_2CH$—), a $C_{1-4}$ alkoxy group, a $C_{1-6}$ alkylcarbonyloxy group, or a $C_{1-6}$ alkylcarbonyl group. $Q_1$, $Q_2$, $Q_3$, and $Q_4$ independently represent —$C_qH_{2q-p}P_p$— (In the formula, P represents the same as above; p represents an integer of 0 to 3; q represents an integer of 0 to 10.) u represents an integer of 0 to 3. $S_1$ and $S_2$ independently represent —O—, —CO—, —OCO—, —COO—, or —OCOO—. v1, v2, and v3 independently represent 0 or 1. Examples of T are shown below. Bonding sites of T to $Q_2$ and $Q_3$ are not particularly limited. The bonding sites may be properly selected in consideration of reactivity depending on stereostructure, availability of commercial reagents to be used for the reaction, and so on.)

T =

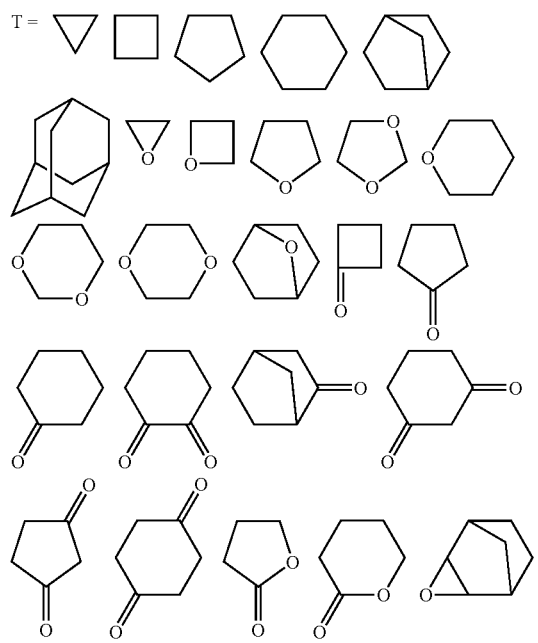

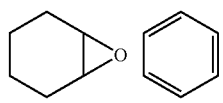

Suitable examples of the organic group having at least one bond of a carbon-oxygen single bond and a carbon-oxygen double bond in the general formula (1) are shown below. Incidentally, (Si) shows a bonding site with a Si atom in the following formulae.

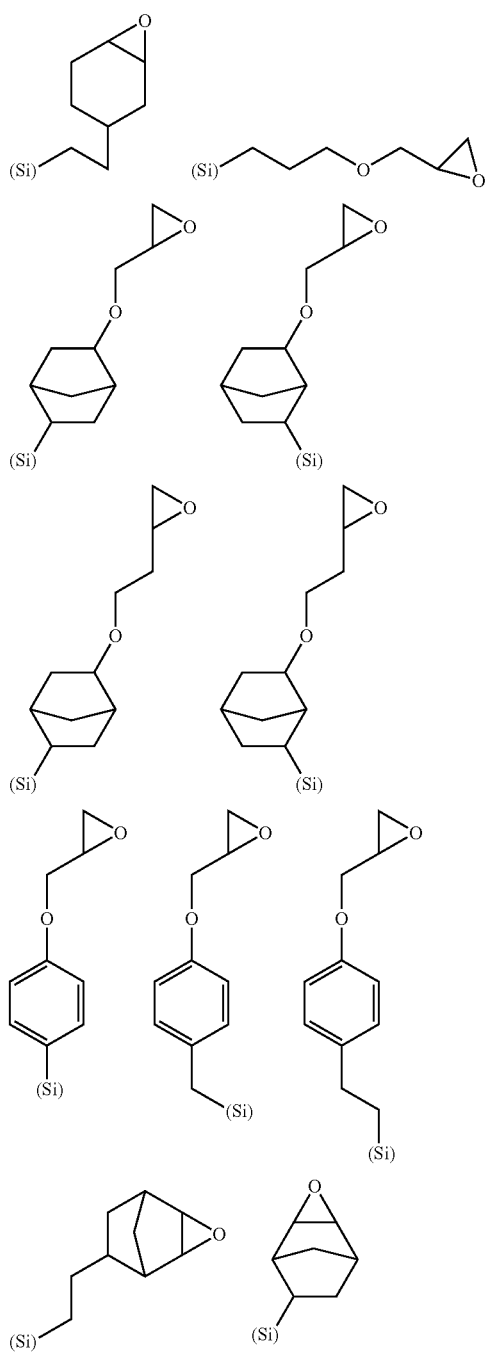

-continued

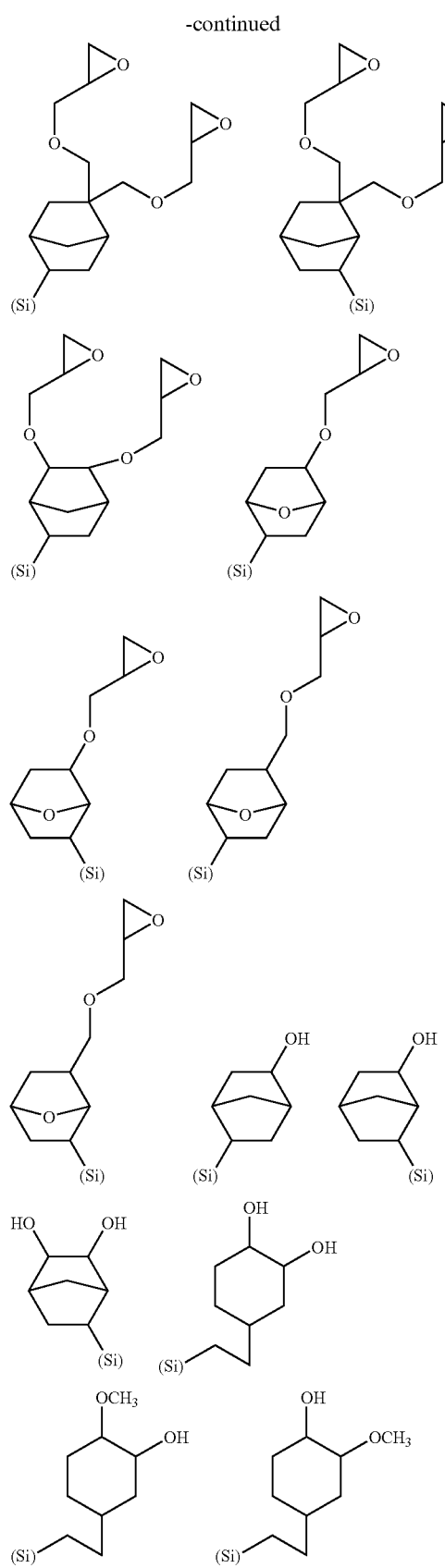

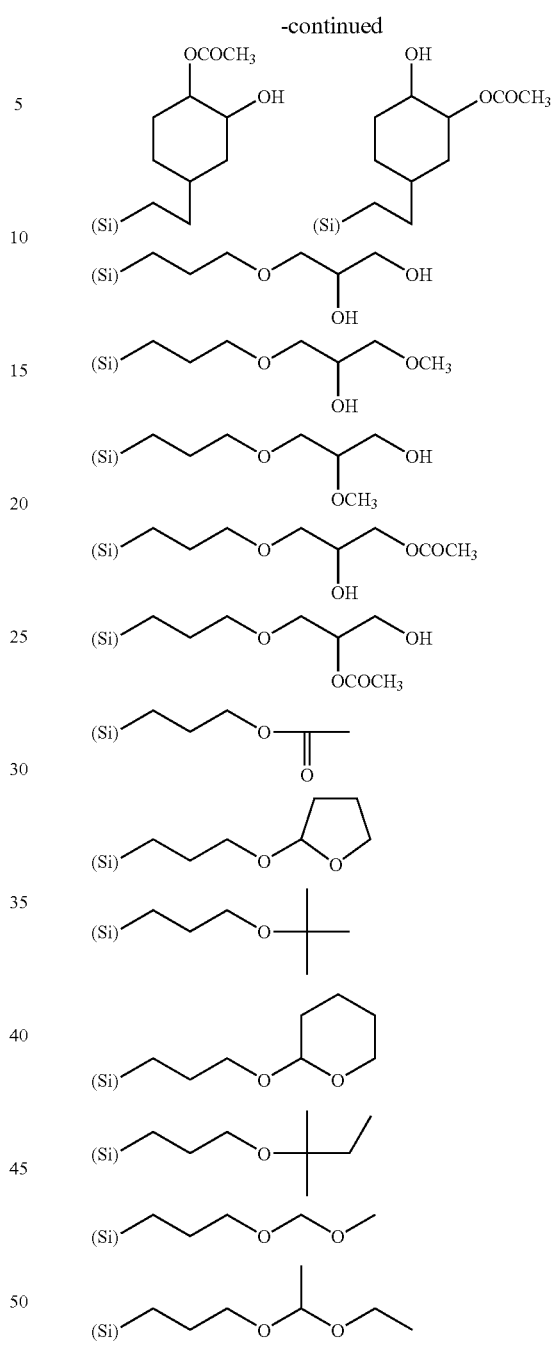

Next, the light absorbing group in the general formula (1) absorbs light at a wavelength of 150 to 300 nm. This group has preferably any one or more of an anthracene ring, a naphthalene ring, and a benzene ring. Furthermore, these rings may have one or more of substituent(s). Suitable examples of the substituent may include $C_{1-6}$ alkyl group, $C_{1-6}$ alkoxy group, $C_{1-6}$ acyloxy group, and $C_{1-6}$ acetal group. More suitable examples of the substituent may include methyl group, methoxy group, t-butoxy group, t-amyloxy group, acetoxy group, 1-ethoxy ethoxy group, or the like. Examples of the light absorbing group are shown below.

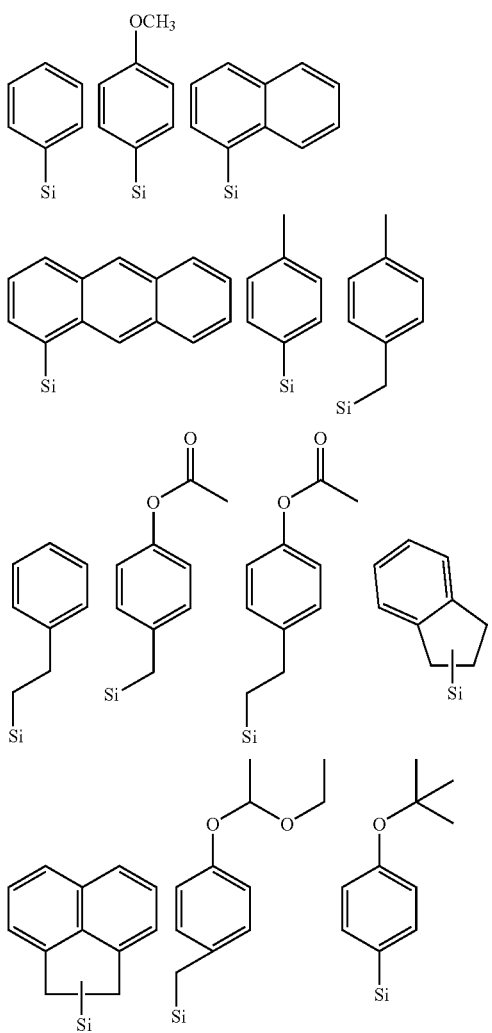

A methoxy group, an acetoxy group and an acetal group in the light absorbing group can also be deprotected to be a hydroxy group during or after polymerization.

In particular, the light absorbing group having a benzene ring or benzene rings is preferably used for lithography using light at a wavelength of 200 nm or less.

In addition to the aromatic light absorbing groups, a light absorbing group which has a Si—Si bond or Si—Si bonds can also be used. Specific examples thereof are shown below.

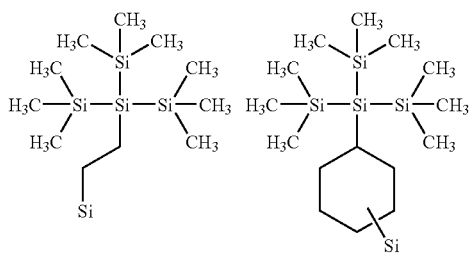

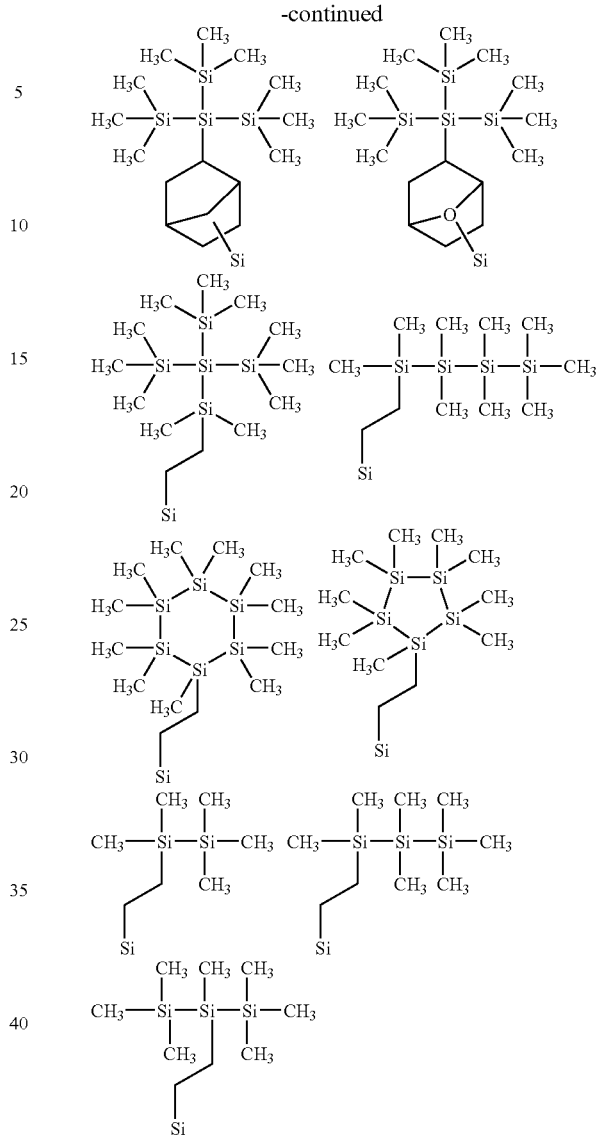

The silicone resin for the antireflection silicone resin film can be synthesized by carrying out hydrolytic co-condensation of the silicon-containing compounds (monomers) represented by the general formula (1).

Water is preferably added in an amount of 0.2-10 moles per one mole of the monomers in the hydrolytic reaction. A catalyst can also be used at this time. Examples of the catalyst may include acids such as acetic acid, propionic acid, oleic acid, stearic acid, linolic acid, salicylic acid, benzoic acid, formic acid, malonic acid, phthalic acid, fumaric acid, citric acid, tartaric acid, hydrochloric acid, sulfuric acid, nitric acid, sulfonic acid, methyl sulfonic acid, toluenesulfonic acid, trifluoromethane sulfonic acid; bases such as ammonia, sodium hydroxide, potassium hydroxide, barium hydroxide, calcium hydroxide, trimethylamine, triethylamine, triethanolamine, tetra methyl ammonium hydroxide, choline hydroxide, tetra butyl ammonium hydroxide; metal chelate compounds such as tetraalkoxy titanium, trialkoxy mono(acetyl acetonate) titanium, tetra alkoxy zirconium, trialkoxy mono (acetyl acetonate) zirconium.

The reaction may be conducted by dissolving water and a catalyst in an organic solvent, and then adding monomers thereto. At this moment, the monomers may be diluted with the organic solvent in advance. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

Alternatively, the reaction may be conducted by dissolving a catalyst without moisture in an organic solvent, and then adding water or water diluted with an organic solvent thereto. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

As for the organic solvent, those soluble in water are preferably used. Examples thereof may include: methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monomethyl ether, ethylene glycol monoethyl ether, propylene glycol dimethyl ether, diethylene glycol dimethyl ether, propylene glycol monomethyl ether acetate, propylene glycol monoethyl ether acetate, propylene glycol monopropyl ether, and a mixture thereof.

After that, an organic solvent which is hardly soluble or insoluble in water is added to the reaction mixture. Then, an organic-solvent layer is separated, and washed with water to remove a catalyst used in the hydrolytic condensation. At this moment, the catalyst may be neutralized when necessary.

Examples of the organic solvent which is hardly soluble or insoluble in water may include: tetrahydrofuran, toluene, hexane, ethyl acetate, cyclohexanone, methyl-2-n-amyl ketone, propyleneglycol monomethyl ether, ethylene glycol monomethyl ether, propylene glycol monomethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, γ-butyl lactone, and a mixture thereof.

Then, an organic-solvent layer is separated and is dehydrated. Because remained moisture advances a condensation reaction of remained silanol, it is necessary to dehydrate the layer sufficiently. For example, an adsorption method with salts such as magnesium sulfate or molecular sieves, or an azeotropic dehydration method with removing the solvent is preferably used.

Alternatively, an organic solvent which is hardly soluble or insoluble in water may be used for hydrolytic condensation of the monomers. Examples thereof may include: tetrahydrofuran, toluene, hexane, ethyl acetate, cyclohexanone, methyl-2-n-amyl ketone, propyleneglycol monomethyl ether, ethylene glycol monomethyl ether, propylene glycol monomethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, γ-butyl lactone, and a mixture thereof.

Then, the monomers are dissolved in the organic solvent, and water is added thereto to initiate hydrolytic reaction.

The catalyst may be added to water or to the organic solvent in advance. A reaction temperature is 0 to 100 degrees C., preferably 10 to 80 degrees C. The following method is preferably used: heating up to 10 to 50 degrees C. at the time of dropping water, and then heating to an elevated temperature of 40 to 80 degrees C. for aging.

By adjusting the reaction conditions in the hydrolytic reaction, a silicone resin in which a ratio of a silicon atom with an end of Si—OH and/or Si—OR is 0.1 to 50 mole %. The end group can be identified easily with $^{29}$Si-NMR. When a ratio of a silicon atom with an end of Si—OH and/or Si—OR is defined as A mole %, A can be expressed by the following equation.

$$A(\%) = \frac{\sum_{n=1}^{3}(4-n)Qn + \sum_{n=1}^{2}(3-n)Tn + D1}{4 \times \sum_{n=1}^{4}Qn + 3 \times \sum_{n=1}^{3}Tn + 2 \times \sum_{n=1}^{2}Dn} \times 100$$

In the formula, $Q_1$, $Q_2$, $Q_3$, and $Q_4$ represent the number of siloxane bonding of a four functional Si atom; $T_1$, $T_2$, and $T_3$ represent the number of siloxane bonding of a trifunctional Si atom; and $D_1$ and $D_2$ represent the number of siloxane bonding of a bifunctional Si atom. Respective bonding amounts are calculated by using integrated peak values measured with $^{29}$Si-NMR.

At this moment, when A is 0.1 mole % or less, the number of end Si—OH and end Si—OR used for crosslinking resin may be so small that an applied film may not set hard enough. Consequently, the applied film can intermix with resist to be used in the subsequent step, and a resist pattern with a vertical wall profile may not be obtained. On the other hand, when A is 50 mole % or more, condensation may not occur enough and an applied film with insufficient strength can be obtained. This can provide undesired results like collapse of a resist pattern.

Furthermore, when A lies in the range of 0.1 mole % to 50 mole %, and the ratio of Si—OH to Si—OR lies in the following range, an applied film that set hard more sufficiently can be obtained. Specifically, it is more preferable that Si—OH/Si—OR is from (100/0) to (20/80). At this time, the ratio of —SiOH/—SiOR can be obtained with $^{13}$C-NMR by using an integral intensity (B) per a carbon atom at alpha position of an Si atom as an internal standard. That is, when R of —SiOR is $R_x$—CH$_2$, —SiOR is —SiO$\underline{C}$H$_2$—R$_x$. And a Si—OR amount (B) is obtained from the ratio of integral intensity of the underlined carbon atom.

Use of $^{29}$Si-NMR provides a total amount (C) of Si—OH and Si—OR. Accordingly, the ratio of Si—OH to Si—OR satisfies the relationship: Si—OH/Si—OR=(C—B)/B.

When the ratio of Si—OR is less than Si—OH/Si—OR=20/80, condensation between Si—OHs and between Si—OH and Si—OR occur easily. Consequently, an applied film with sufficient strength that hardly intermix with other layers can be obtained.

Furthermore, when the organic group with carbon-oxygen bonds has an epoxy group, silicone resin is synthesized, and then modification reaction can convert the silicone resin to modified silicone resin having an organic group with mutually different carbon-oxygen bonds. Examples of an repeating unit of the modified silicone resin are shown below.

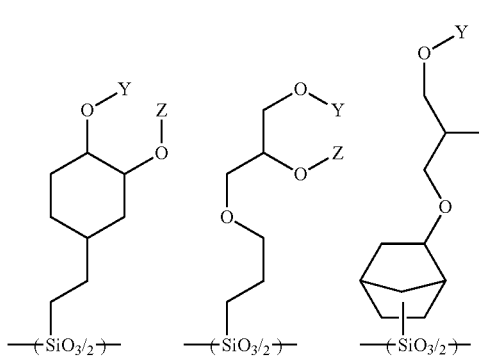
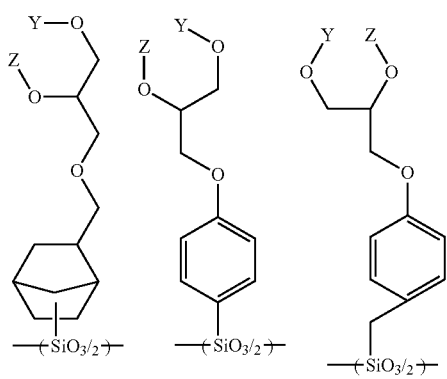
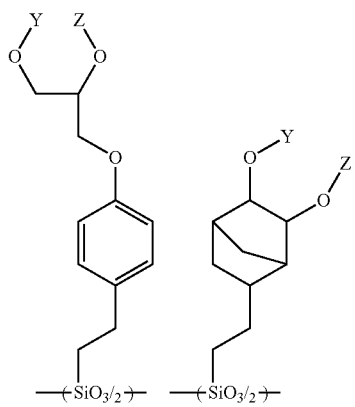
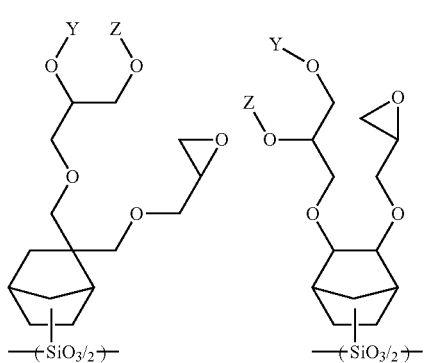
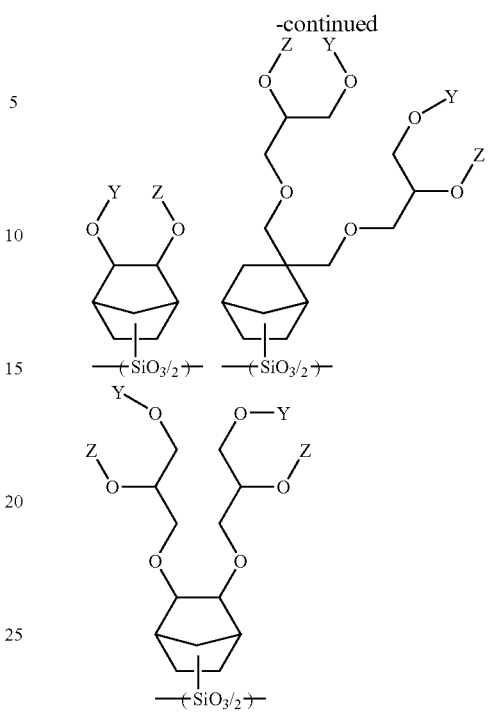

In the formulae, Y and Z independently represent a hydrogen atom, a $C_{1-6}$ alkyl group, a $C_{1-8}$ alkylcarbonyl group, or a $C_{1-6}$ alkoxycarbonyl group. Specifically, examples thereof may include: methyl group, ethyl group, n-propyl group, i-propyl group, n-butyl group, i-butyl group, sec-butyl group, t-butyl group, n-pentyl group, 2-ethylbutyl group, 3-ethylbutyl group, 2,2-diethylpropyl group, cyclopentyl group, n-hexyl group, cyclohexyl group, formyl group, acetyl group, propionyl group, butyryl group, isobutyryl group, valeryl group, iso valeryl group, pivaloyl group, cyclohexylcarbonyl group, methoxycarbonyl group, ethoxycarbonyl group, propoxycarbonyl group, butoxycarbonyl group, t-butoxycarbonyl group, and so on.

The conversion from an original silicone resin can be carried out with a commonly known techniques. For example, heating the original silicone resin together with alcohols or carboxylic acids in the presence of an acid catalyst, an alkaline catalyst, or quaternary ammonium catalyst converts the original silicone resin to a modified silicone resin easily. Incidentally, when a carboxylic acid is used in the reaction, the carboxylic acid itself works as a catalyst. Therefore, it is not necessary to add other catalyst.

Examples of the acid catalyst used for the reaction may include: hydrochloric acid, nitric acid, sulfuric acid, phosphoric acid, perchloric acid, methansulfonic acid, benzenesulfonic acid, toluenesulfonic acid, trifluoro acetic acid, trifluoromethane sulfonic acid, oxalic acid, acetic acid, propionic acid, oleic acid, stearic acid, linoleic acid, salicylic acid, benzoic acid, formic acid, malonic acid, phthalic acid, fumaric acid, citric acid, tartaric acid, and so on.

Examples of the alkaline catalyst may include: bases such as ammonia, sodium hydroxide, potassium hydroxide, barium hydroxide, calcium hydroxide, triethylamine, triethanolamine, benzyl diethylamine, tetraethylammonium hydroxide, choline hydroxide, tetrabutylammonium hydroxide; quaternary ammonium catalysts such as benzyl triethylammonium chloride, benzyl triethylammonium bromide.

Blend of thus-obtained original silicone resin and modified silicone resin can also be used (hereinafter, "silicone resin" includes the original silicone resin, the modified silicone resin and blend of both). A blend ratio thereof has a significant effect on properties of an antireflection silicone resin film composition to be obtained. Accordingly, the silicone resin can be blended with an arbitrary ratio so that the best properties are obtained. It is more preferable to subject obtained blend to heating, stirring, ultrasonic irradiation, kneading, and so on to make the polymer composition uniform.

An organic solvent used for the antireflection silicone resin film composition can be any organic solvent in which silicone resin, an acid generator, other additives and the like can be dissolved. Examples of such an organic solvent may include: ketones such as cyclohexanone and ethyl-2-n-amyl ketone; alcohols such as 3-methoxy butanol, 3-ethyl-3-methoxy butanol, 1-methoxy-2-propanol, 1-ethoxy-2-propanol; ethers such as propylene glycol monoethyl ether, ethylene glycol monoethyl ether, propylene glycol monoethyl ether, ethylene glycol monoethyl ether, propylene glycol diethyl ether, diethylene glycol diethyl ether; esters such as propylene glycol monoethyl ether acetate, propylene glycol monoethyl ether acetate, ethyl lactate, ethyl pyruvate, butyl acetate, ethyl 3-methoxy propionate, ethyl 3-ethoxy propionate, tert-butyl acetate, tert-butyl propionate, propylene-glycol mono tert-butyl-ether acetate; lactones such as γ-butyrolactone. Above solvents may be used alone or in admixture. The organic solvents are not restricted to those mentioned above.

Among the above organic solvents, diethylene glycol diethyl ether, 1-ethoxy-2-propanol, propylene glycol monoethyl ether acetate, or a mixture thereof is preferably used, because the solubility of an acid generator in the resist composition to these solvents is remarkably excellent.

Preferably, the organic solvent is used in an amount of 400 to 500,000 parts by mass, more preferably 500 to 100,000 parts by mass, to 100 parts by mass of the silicone resin.

To the antireflection silicone resin film, an acid generator can be added for further promoting a crosslinking reaction by heat. There are an acid generator which generates acid by pyrolysis and an acid generator which generates acid by optical irradiation, and either acid generator can be added.

Examples of the acid generator to be added are as follows:
i) an onium salt represented by the following general formulae (P1a-1), (P1a-2), (P1a-3) or (P1b),
ii) a diazomethane derivative represented by the following general formula (P2),
iii) a glyoxime derivative represented by the following general formula (P3),
iv) a bis sulfone derivative represented by the following general formula (P4),
v) a sulfonate of an N-hydroxy imide compound represented by the following general formula (P5),
vi) a β-keto sulfonic-acid derivative,
vii) a disulfone derivative,
viii) a nitro benzyl sulfonate derivative, and
ix) a sulfonate derivative, etc.

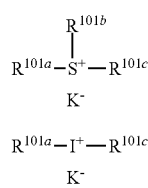

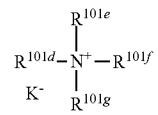

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, or an aralkyl group or an aryl oxoalkyl group having 7-12 carbon atoms. Some or all of hydrogen atoms of these groups may be substituted with an alkoxy group etc. $R^{101b}$ and $R^{101c}$ may constitute a ring. In the case that they constitute a ring, $R^{101b}$ and $R^{101c}$ represent an alkylene group having 1-6 carbon atoms respectively. $K^-$ represents a non-nucleophilic counter ion. $R^{101d}$, $R^{101e}$, $R^{101f}$ and $R^{101g}$ are represented by adding a hydrogen atom to $R^{101a}$, $R^{101b}$, and $R^{101c}$. $R^{101d}$ and $R^{101e}$, and $R^{101d}$, $R^{101e}$ and $R^{101f}$ may form a ring respectively. When they form a ring, $R^{101d}$ and $R^{101e}$, and $R^{101d}$, $R^{101e}$, and $R^{101f}$, represent an alkylene group having 3-10 carbon atoms.)

The above-mentioned $R^{101a}$, $R^{101b}$, $R^{101c}$, $R^{101d}$, $R^{101e}$, $R^{101f}$, and $R^{101g}$ may be the same or different mutually. Examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl ethyl group, 4-ethyl cyclohexyl group, a cyclohexyl ethyl group, a norbornyl group, and an adamantyl group, etc. Examples of an alkenyl group may include: a vinyl group, an allyl group, a propenyl group, a butenyl group, a hexenyl group, and a cyclohexenyl group, etc. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-ethylcyclohexyl)-2-oxoethyl group, etc. Examples of an oxoalkenyl group may include: 2-oxo-4-cyclohexenyl group, 2-oxo-4-propenyl group, etc. Examples of an aryl group may include: a phenyl group, a naphthyl group, etc.; and an alkoxy phenyl group such as p-methoxyphenyl group, m-methoxyphenyl group, o-methoxyphenyl group, an ethoxyphenyl group, p-tert-butoxyphenyl group and m-tert-butoxy phenyl group; an alkyl phenyl group such as 2-methylphenyl group, 3-methylphenyl group, 4-methylphenyl group, an ethylphenyl group, 4-tert-butylphenyl group, 4-butylphenyl group, a diethyl phenyl group, etc.; an alkyl naphthyl group such as a methylnaphthyl group, an ethyl naphthyl group, etc.; an alkoxy naphthyl group such as a methoxy naphthyl group, an ethoxy naphthyl group, etc.; a dialkyl naphthyl group such as a dimethyl naphthyl group, a diethyl naphthyl group, etc.; a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc.

Examples of a non-nucleophilic counter ion as $K^-$ may include: a halide ion such as a chloride ion, a bromide ion, etc.; a fluoro alkyl sulfonate such as triflate, 1,1,1-trifluoro ethanesulfonate, nonafluoro butane sulfonate, etc.; an aryl sulfonate such as tosylate, benzene sulfonate, 4-fluorobenzene sulfonate, 1,2,3,4,5-pentafluoro benzene sulfonate, etc.; and an alkyl sulfonate such as mesylate, butane sulfonate, etc.

While (P1a-1) and (P1a-2) have both effects of a photo acid generator and a thermal acid generator, (P1a-3) acts as a thermal acid generator.

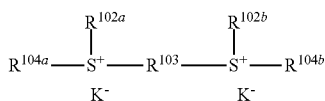

P1b (In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylethyl group, 4-ethylcyclohexyl group, a cyclohexyl ethyl group, etc.

Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, etc.

Examples of $R^{104a}$ and $R^{104b}$ may include: 2-oxopropyl group, 2-oxocyclopentyl group, 2-oxocyclohexyl group, 2-oxocycloheptyl group, etc.

Examples of $K^-$ may include the same as mentioned in the formulae (P1a-1), (P1a-2) and (P1a-3).

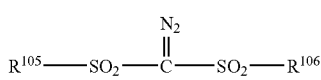

P2

(In the formula, $R^{105}$ and $R^{106}$ independently represent a linear, branched or cyclic alkyl group or a halogenated alkyl group having 1-12 carbon atoms, an aryl group or a halogenated aryl group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group, etc.

Examples of a halogenated alkyl group as $R^{105}$ and $R^{106}$ may include: trifluoroethyl group, 1,1,1-trifluoroethyl group, 1,1,1-trichloroethyl group, a nonafluoro butyl group, etc. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group, etc.; and an alkylphenyl group such as 2-ethylphenyl group, 3-ethylphenyl group, 4-ethylphenyl group, a methylphenyl group, 4-tert-butylphenyl group, 4-butylphenyl group, a diethylphenyl group, etc.

Examples of a halogenated aryl group as $R^{105}$ and $R^{106}$ may include: a fluorophenyl group, a chlorophenyl group, 1,2,3,4,5-pentafluoro phenyl group, etc.

Examples of an aralkyl group as $R^{105}$ and $R^{106}$ may include: a benzyl group, a phenethyl group, etc.

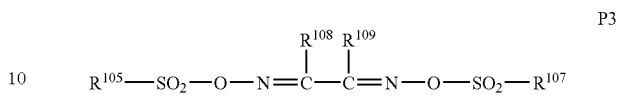

P3

(In the formula, $R^{107}$, $R^{108}$ and $R^{109}$ independently represent a linear, branched, cyclic alkyl group or halogenated alkyl group having 1-12 carbon atoms, an aryl group or a halogenated aryl group having 6-20 carbon atoms, or an aralkyl group having 7-12 carbon atoms. $R^{108}$ and $R^{109}$ may be bonded each other and form a cyclic structure. When they form a cyclic structure, $R^{108}$ and $R^{109}$ each independently represents a linear or branched alkylene group having 1-6 carbon atoms. $R^{105}$ represents the same group as that in the formula P2.)

Examples of the alkyl group, the halogenated alkyl group, the aryl group, the halogenated aryl group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, etc.

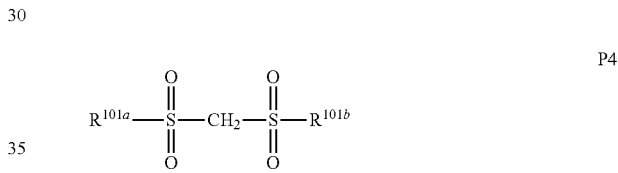

P4

(In the formula, $R^{101a}$ and $R^{101b}$ are the same as explained above.)

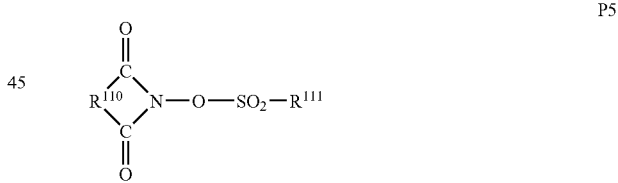

P5

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphthylene group, etc. Examples of the alkylene group may include: a methylene group, an ethylene group, a trimethylene group, a tetramethylene group, a phenylethylene group, a norbornane-2,3-di-yl group, etc. Examples of the alkenylene group may include: 1,2-vinylene group, 1-phenyl-1,2-vinylene group, 5-norbornene-2,3-di-yl group, etc.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a diethyl allyl group, a 1-hexenyl group, a 3-hexenyl group, a 5-hexenyl group, a 1-heptenyl group, a 3-heptenyl group, a 6-heptenyl group, a 7-octenyl group, etc. Examples of the alkoxy alkyl group may include: a methoxy ethyl group, an ethoxy ethyl group, a propoxy ethyl group, a butoxy ethyl group, a pentyloxy ethyl group, a hexyloxy ethyl group, a heptyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, etc.

Examples of the alkyl group having 1-4 carbon atoms which may be further substituted may include: a methyl group, an ethyl group, a propyl group, an isopropyl group, an n-butyl group, an isobutyl group, a tert-butyl group, etc. Examples of the alkoxy group having 1-4 carbon atoms may include: a methoxy group, an ethoxy group, a propoxy group, an isopropoxy group, an n-butoxy group, an isobutoxy group, a tert-butoxy group, etc.

Examples of the phenyl group which may be substituted with an alkyl group and an alkoxy group having 1-4 carbon atoms, a nitro group or an acetyl group may include: a phenyl group, a tolyl group, a p-tert-butoxy phenyl group, a p-acetyl phenyl group, a p-nitrophenyl group, etc. Examples of a hetero aromatic group having 3-5 carbon atoms may include: a pyridyl group, a furyl group, etc.

Examples of an acid generator may include: an onium salt such as tetraethyl ammonium trifluoromethane sulfonate, tetraethyl ammonium nonafluoro butane sulfonate, tetra n-butyl-ammonium nonafluoro butane sulfonate, tetraphenyl ammonium nonafluoro butane sulfonate, tetraethyl ammonium p-toluene sulfonate, diphenyl iodinium trifluoromethane sulfonate, (p-tert-butoxy phenyl) phenyl iodinium trifluoromethane sulfonate, diphenyl iodinium p-toluene sulfonate, (p-tert-butoxy phenyl) phenyl iodinium p-toluene sulfonate, triphenyl sulfonium trifluoromethane sulfonate, (p-tert-butoxy phenyl) diphenyl sulfonium trifluoromethane sulfonate, bis(p-tert-butoxy phenyl) phenyl sulfonium trifluoromethane sulfonate, tris (p-tert-butoxy phenyl) sulfonium trifluoromethane sulfonate, triphenyl sulfonium p-toluene sulfonate, (p-tert-butoxy phenyl) diphenyl sulfonium p-toluene sulfonate, bis(p-tert-butoxy phenyl) phenyl sulfonium p-toluene sulfonate, tris (p-tert-butoxy phenyl) sulfonium p-toluene sulfonate, triphenyl sulfonium nonafluoro butane sulfonate, triphenyl sulfonium butane sulfonate, triethyl sulfonium trifluoromethane sulfonate, triethyl sulfonium p-toluene sulfonate, cyclohexyl ethyl (2-oxocyclohexyl) sulfonium trifluoromethane sulfonate, cyclohexyl ethyl (2-oxo cyclohexyl) sulfonium p-toluene sulfonate, diethyl phenyl sulfonium trifluoromethane sulfonate, diethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbonyl) ethyl (2-oxocyclohexyl) sulfonium trifluoromethane sulfonate, ethylene bis [ethyl (2-oxocyclopentyl) sulfonium trifluoromethane sulfonate], 1,2'-naphthyl carbonyl ethyl-tetrahydro thiophenium triflate, etc.

Examples of a diazomethane derivative may include: bis (benzene sulfonyl) diazomethane, bis(p-toluene sulfonyl) diazomethane, bis(xylene sulfonyl) diazomethane, bis(cyclohexyl sulfonyl) diazomethane, bis(cyclopentyl sulfonyl) diazomethane, bis(n-butylsulfonyl) diazomethane, bis(isobutyl sulfonyl) diazomethane, bis(sec-butylsulfonyl) diazomethane, bis(n-propylsulfonyl) diazomethane, bis(isopropyl sulfonyl) diazomethane, bis(tert-butyl-sulfonyl) diazomethane, bis(n-amylsulfonyl) diazomethane, bis (isoamylsulfonyl) diazomethane, bis(sec-amylsulfonyl) diazomethane, bis(tert-amylsulfonyl) diazomethane, 1-cyclohexylsulfonyl-1-(tert-butyl-sulfonyl) diazomethane, 1-cyclohexyl sulfonyl-1-(tert-amyl sulfonyl) diazomethane, 1-tert-amyl sulfonyl-1-(tert-butyl-sulfonyl) diazomethane, etc.

Examples of a glyoxime derivative may include: bis-O-(p-toluene sulfonyl)-α-diethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-ethyl-3,4-pentanedione glyoxime, bis-O-(n-butane sulfonyl)-α-diethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-ethyl-3,4-pentanedione glyoxime, bis-O-(methane sulfonyl)-α-diethylglyoxime, bis-O-(trifluoromethane sulfonyl)-α-diethylglyoxime, bis-O-(1,1,1-trifluoro ethane sulfonyl)-α-diethylglyoxime, bis-O-(tert-butane sulfonyl)-α-diethylglyoxime, bis-O-(perfluoro octane sulfonyl)-α-diethylglyoxime, bis-O-(cyclohexane sulfonyl)-α-diethylglyoxime, bis-O-(benzene sulfonyl)-α-diethylglyoxime, bis-O-(p-fluorobenzene sulfonyl)-α-diethylglyoxime, bis-O-(p-tert-butylbenzene sulfonyl)-α-diethylglyoxime, bis-O-(xylene sulfonyl)-α-diethylglyoxime, bis-O-(camphor sulfonyl)-α-diethylglyoxime, etc.

Examples of a bissulfone derivative may include: bis naphthyl sulfonyl methane, bis-trifluoro ethyl sulfonyl methane, bis ethyl sulfonyl methane, bis propyl sulfonyl methane, bis isopropyl sulfonyl methane, bis-p-toluene sulfonyl methane, bis benzene sulfonyl methane, etc.

Examples of the β-ketosulfone derivative may include: 2-cyclohexyl carbonyl-2-(p-toluene sulfonyl) propane, 2-isopropyl carbonyl-2-(p-toluene sulfonyl) propane, etc.

Examples of the disulfone-derivative may include: a diphenyl disulfone derivative, a diyclohexyl disulfone derivative, etc.

Examples of the nitro benzyl sulfonate derivative may include: 2,6-dinitro benzyl p-toluenesulfonate, 2,4-dinitro benzyl p-toluenesulfonate, etc.

Examples of the sulfonate derivative may include: 1,2,3-tris(methane sulfonyloxy) benzene, 1,2,3-tris(trifluoromethane sulfonyloxy) benzene, 1,2,3-tris(p-toluene sulfonyloxy) benzene, etc.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-triethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate, etc.

Suitable examples thereof may include: an onium salt such as triphenyl sulfonium trifluoromethane sulfonate, (p-tert-butoxy phenyl) diphenyl sulfonium trifluoromethane sulfonate, tris (p-tert-butoxy phenyl) sulfonium trifluoromethane sulfonate, triphenyl sulfonium p-toluene sulfonate, (p-tert-butoxy phenyl) diphenyl sulfonium p-toluene sulfonate, tris (p-tert-butoxy phenyl) sulfonium p-toluene sulfonate, trinaphthylsulfonium trifluoromethane sulfonate, cyclohexyl ethyl (2-oxocyclohexyl) sulfonium trifluoromethane sulfonate, (2-norbonyl)ethyl (2-oxocyclohexyl) sulfonium trifluoromethane sulfonate, 1,2'-naphthyl carbonylethyl tetrahydrothiophenium triflate, etc.;

a diazomethane derivative such as bis(benzene sulfonyl) diazomethane, bis(p-toluene sulfonyl) diazomethane, bis(cyclohexyl sulfonyl) diazomethane, bis(n-butylsulfonyl) diazomethane, bis(isobutyl sulfonyl) diazomethane, bis(sec-butylsulfonyl) diazomethane, bis(n-propyl sulfonyl) diazomethane, bis(isopropyl sulfonyl) diazomethane, bis (tert-butylsulfonyl) diazomethane, etc.;

a glyoxime derivative, such as bis-O-(p-toluene sulfonyl)-α-diethylglyoxime, bis-O-(n-butane sulfonyl)-α-diethylglyoxime, etc.;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzene sulfonate, etc.

Incidentally, the acid generator may be used alone or in admixture.

An amount of the acid generator to be added is preferably 0.1 to 50 parts by mass, more preferably 0.3 to 40 parts by mass per 100 parts by mass of the silicone resin. When 0.1 parts by mass or more of the acid generator is added, sufficient amount of acid is generated and a crosslinking reaction is induced sufficiently. On the other hand, when 50 parts by mass or less of the acid generator is added, there is less possibility that mixing phenomenon in which acid migrates to the upper photoresist layer occurs.

By the way, neutralizer may be added to the antireflection silicone resin film.

The neutralizer is a composition that prevents generated acid from diffusing to a photoresist film to be applied in the subsequent step. Examples of the neutralizer may include: an epoxy compound, a melamine compound, a guanamine compound, a glycol uryl compound and an urea compound, substituted by at least one group selected from a group consisting of a methylol group, an alkoxy ethyl group, and acyloxy ethyl group, and so on.

Examples of the epoxy compound among the neutralizer include: tris (2,3-epoxy propyl) isocyanurate, tri methylol methane tri glycidyl ether, trimethylol propane tri glycidyl ether, tri ethylol ethane triglycidyl ether, and the like.

Illustrative examples of the melamine compound among the neutralizer include: hexamethylol melamine, hexamethoxy ethyl melamine, a compound in which 1-6 of methylol groups of hexamethylol melamine is methoxy ethylated and a mixture thereof, hexamethoxy ethyl melamine, hexaacyloxy ethyl melamine, and a compound in which 1-5 of methylol groups of hexamethylol melamine is acyloxy ethylated and a mixture thereof.

Examples of a guanamine compound among the neutralizer include: tetramethylol guanamine, tetra methoxy ethyl guanamine, a compound in which 1-4 of methylol groups of a tetramethylol guanamine is methoxy ethylated and a mixture thereof, tetra methoxy ethyl guanamine, tetra acyloxy guanamine, and a compound in which 1-4 of methylol groups of tetramethylol guanamine is acyloxy ethylated and a mixture thereof.

Examples of a glycol uryl compound among the neutralizer include: tetramethylol glycol uryl, tetra methoxy glycol uryl, tetra methoxy ethyl glycol uryl, a compound in which 1-4 of the methylol groups of tetramethylol glycol uryl is metoxy ethylated and a mixture thereof, and a compound in which 1-4 of the methylol groups of tetrametylol glycol uryl is acyloxy ethylated and a mixture thereof.

Examples of an urea compound among the neutralizer include: tetramethylol urea, tetramethoxy methyl urea, and a compound in which 1-4 of methylol groups of tetramethylol urea are methoxy ethylated and a mixture thereof.

An amount of the neutralizer to be added is preferably 0 to 50 parts (hereinafter, parts means parts by mass), more preferably 0 to 40 parts per 100 parts of the silicone resin.

By the way, generally known photoresist film compositions can be used for forming the photoresist film. For example, base resin, organic solvent, and acid generator may be combined and used as the composition. Examples of the base resin may include one or more polymer(s) selected from the group: polyhydroxystyrene and its derivatives; polyacrylic acid and its derivatives; polymethacrylic acid and its derivatives; copolymer synthesized with selecting monomers from hydroxystyrene, acrylic acid, methacrylic acid and derivatives thereof; copolymer synthesized with selecting three or more monomers from cycloolefin and its derivatives, maleic anhydride, and acrylic acid and its derivatives; copolymer synthesized with selecting three or more monomers from cycloolefin and its derivatives, maleimide, and acrylic acid and its derivatives; polynorbornene; and ring-opening metathesis polymer. Incidentally, the derivatives as mentioned above each has its original main skeleton after being derived. For example, acrylic acid derivatives include acrylate and so on, methacrylic acid derivatives include methacrylate and so on, and hydroxystyrene derivatives include alkoxystyrene and so on.

In particular, photoresist film compositions for KrF excimer laser may include: polyhydroxystyrene (PHS), copolymer synthesized with selecting monomers from hydroxystyrene, styrene, acrylate, methacrylate and maleimide N carboxylate. Photoresist film compositions for ArF excimer laser may include: polyacrylates, polymethacrylates, alternating copolymers of norbornene and maleic anhydride, alternating copolymers of tetracyclododecene and maleic anhydride, polynorbornenes, and ring-opening metathesis polymers. However, photoresist film compositions are not restricted thereto.

In positive photoresist film compositions, a dissolution rate at non-exposed areas are generally decreased by substituting a hydroxy group of phenol or a carboxyl group with an acid labile group. That is, a base resin in which a hydrogen atom of a carboxyl group or a hydrogen atom of a phenolic hydroxy group is substituted with an acid labile group with the capability of controlling alkali solubility; and an acid generated upon exposure cleaves the acid labile group to enhance solubility to aqueous alkaline solutions is combined with other components to provide positive photoresist film composition.

As for an organic solvent and an acid generator for photoresist film compositions, the above-mentioned organic solvents and acid generators for silicone resin film compositions can be used. As for an addition amount of each component in photoresist film composition, for example, an addition amount of the base resin is as with an addition amount of silicone resin in silicone resin film composition; and an addition amount of the organic solvent and the acid generator for photoresist film compositions is as with an addition amount of the organic solvent and the acid generator for silicone resin film compositions.

Examples of resin for an organic film may include: cresol-novolac, naphthol-novolac, naphtholdicyclopentadien-novolac, amorphous carbon, polyhydroxystyrene, acrylate, methacrylate, polyimide, polysulfone and so on.

The substrate 10 to be used for patterning is not particularly limited and silicon wafers and so on can be used.

A thickness of each film are, for example, 50 to 2000 nm for the organic film 11, 10 to 2000 nm for the antireflection silicone resin film 16 (1 to 500 nm for the upper silicone resin film 13, and 9 to 1500 nm for the lower silicone resin film 12), and 0.1 to 1 μm (preferably, 100 to 500 nm) for the photoresist film 14. However, each thickness is not limited thereto.

Hereinafter, a patterning process according to the present invention will be explained.

FIG. 3 is an explanatory view of one embodiment of a patterning process according to the present invention.

As shown in FIG. 2 (e), a substrate with an organic film, an antireflection silicone resin film over the organic film, and a photoresist film over the antireflection silicone resin film is produced by the method for producing a substrate according to the present invention. Then, firstly, as shown in FIG. 3 (a), pattern circuit areas are exposed.

Secondly, as shown in FIG. 3 (b), post exposure baking (PEB) and development with a developer are conducted to form a resist pattern on the photoresist film 14.

In the present invention, the upper silicone resin film 13 has lower silicon content than the lower silicone resin film 12. A film with lower silicon content shows excellent resist compatibility.

Thirdly, as shown in FIG. 3 (c), the antireflection silicone resin film 16 is etched with using the patterned photoresist film 14 as a mask to transfer the resist pattern to the antireflection silicone resin film 16 and to pattern the antireflection silicone resin film 16.

In order to etch the antireflection silicone resin film 16 with using the photoresist film 14 as a mask, etching is performed by using flon gases, nitrogen gas, carbon dioxide gas, or the like.

Next, as shown in FIG. 3 (d), the pattern formed on the antireflection silicone resin film 16 is transferred to the organic film 11 by oxygen plasma etching or the like to form a pattern on the organic film 11. At this time, the photoresist film 14 is also etched and removed.

Incidentally, as for dry etching conditions, besides the method using oxygen-containing plasma, a method using hydrogen-nitrogen containing gas plasma and so on can also be used.

In the present invention, the lower silicone resin film has higher silicon content than the upper silicone resin film. A film with higher silicon content shows high etching resistance at the time of etching the organic film.

As mentioned above, in order to achieve both excellent resist compatibility and high etching resistance at the time of etching the organic film in the present invention, the antireflection silicone resin film includes two layers of the upper silicone resin film and the lower silicone resin film. And the upper silicone resin film has excellent resist compatibility, while the lower silicone resin film has high etching resistance at the time of etching the organic film. Consequently, a pattern can be transferred to the organic film with high precision.

Then, as shown in FIG. 3 (e), the substrate 10 is etched with using the patterned organic film 11 as a mask to transfer the pattern to the substrate 10. Consequently, the pattern is formed on the substrate 10.

For example, when the process layer of the substrate 10 is made of silicon oxide, metal silicon or the like, dry etching conditions using fluoride gases are preferably used. Use of dry etching conditions using fluoride gases removes the silicone resin film 16 remaining on the organic film 11 while the substrate is etched. However, etching conditions are not limited thereto and any etching conditions used for monolayer resist methods can be used. For example, dry etching conditions using chloride gases can also be used.

As mentioned above, the present invention is capable of patterning a substrate with high precision.

Incidentally, after the pattern is formed on the substrate 10 with the above steps, the organic film 11 remaining on the substrate 10 can be removed, for example, by etching with oxygen plasma, hydrogen-nitrogen, and so on (see FIG. 3 (f)).

EXAMPLE

Hereinafter, the present invention will be explained further in detail with reference to Examples, Comparative Examples and so on. However, the present invention is not limited by these descriptions.

Synthetic Example 1

In a 3000 ml glass flask, 1400 g of ethanol, 700 g of pure water, and 50 g of 25% tetraethylammonium hydroxide were placed, and stirred. To this mixture was added dropwise a mixture of 139 g of 2-(3,4-epoxycyclohexyl) ethyl trimethoxy silane and 32 g of phenyl trimethoxy silane at a liquid temperature of 40 degrees C. After that, the solution was stirred for 2 hours at 40 degrees C. After the reaction finished, the reaction was quenched by adding 35 g of acetic acid, and ethanol was removed under a reduced pressure. To thus-obtained solution was added 2000 ml of ethyl acetate, and a water layer was separated. An organic layer was washed twice with ultrapure water. To this contents was added 600 g of propylene glycol monomethyl ether acetate (PGMEA), and the contents were heated up to a liquid temperature of 40 degrees C. under a reduced pressure to remove ethyl acetate and to give a PGMEA solution of a polymer.

The polymer was termed polymer 1. In order to measure the yield of the polymer 1, about 1 g of the polymer solution was weighed accurately, and subsequently dried in a drier at 150 degrees C. for 1 hour. Then the evaporation residue was weighed again, and the yield was 100% in relation to the theoretical value that all added monomers were hydrolyzed completely. As is evident from this result, all the monomers used in the reaction were converted into the polymer, and were hydrolyzed completely. And by calculating the added composition, it was found that the polymer had a silicon content of 17 mass %, and a carbon content of 55 mass %.

Synthetic Example 2

In a 3000 ml glass flask, 1400 g of ethanol, 700 g of pure water, and 50 g of 25% tetraethylammonium hydroxide were placed, and stirred. To this mixture was added dropwise a mixture of 79 g of 2-(3,4-epoxycyclohexyl) ethyl trimethoxy silane, 70 g of tetraethoxy silane, and 14 g of phenyl trimethoxy silane at a liquid temperature of 40 degrees C. After that, the solution was stirred for 2 hours at 40 degrees C. After the reaction finished, the reaction was quenched by adding 35 g of acetic acid, and ethanol was removed under a reduced pressure. To thus-obtained solution was added 2000 ml of ethyl acetate, and a water layer was separated. An organic layer was washed twice with ultrapure water. To this contents was added 600 g of propylene glycol monomethyl ether acetate (PGMEA), and the contents were heated up to a liquid temperature of 40 degrees C. under a reduced pressure to remove ethyl acetate and to give a PGMEA solution of a polymer.

The polymer was termed polymer 2. In order to measure the yield of the polymer 2, about 1 g of the polymer solution was weighed accurately, and subsequently dried in a drier at 150 degrees C. for 1 hour. Then the evaporation residue was weighed again, and the yield was 100% in relation to the theoretical value that all added monomers were hydrolyzed completely. As is evident from this result, all the monomers used in the reaction were converted into the polymer, and were hydrolyzed completely. And by calculating the added composition, it was found that the polymer had a silicon content of 24 mass %, and a carbon content of 42 mass %.

Synthetic Example 3

In a 1000 ml glass flask, to a mixture of 150 g of methanol, 22 g of 2-(3,4-epoxycyclohexyl) ethyl trimethoxy silane, 77 g of trimethoxymethyl silane, 14 g of phenyl trimethoxy silane, and 1.5 g of oxalic acid was added dropwise a mixed solution of 40 g of deionized water and 20 g of methanol at a liquid temperature of 40 degrees C. After that, this solution was stirred for 12 hours at 40 degrees C. After the reaction finished, the solvent was removed under a reduced pressure. Thus-obtained residue was dissolved in 1000 ml of ethyl acetate, and washed with deionized water for washing. After the water layer was separated, the organic layer was washed twice with deionized water. To this organic layer was added 600 g of propylene glycol monomethyl ether acetate (PGMEA), and the contents were heated up to a liquid temperature of 40 degrees C. under a reduced pressure to remove ethyl acetate and to give a PGMEA solution of a polymer.

The polymer was termed polymer 3. In order to measure the yield of the polymer 3, about 1 g of the polymer solution was weighed accurately, and subsequently dried in a drier at 150 degrees C. for 1 hour. Then the evaporation residue was weighed again, and the yield was 100% in relation to the theoretical value that all added monomers were hydrolyzed completely. As is evident from this result, all the monomers used in the reaction were converted into the polymer, and were hydrolyzed completely. And by calculating the added composition, it was found that the polymer had a silicon content of 32 mass %, and a carbon content of 29 mass %.

Synthetic Example 4

In a 1000 ml glass flask, to a mixture of 150 g of methanol, 13 g of 2-(3,4-epoxycyclohexyl) ethyl trimethoxy silane, 41 g of trimethoxymethyl silane, 62 g of tetraethoxy silane, 16 g of phenyl trimethoxy silane, and 1.5 g of maleic acid was added dropwise a mixed solution of 45 g of deionized water and 20 g of methanol at a liquid temperature of 40 degrees C. After that, this solution was stirred for 12 hours at 40 degrees C. After the reaction finished, the solvent was removed under a reduced pressure. Thus-obtained residue was dissolved in 1000 ml of ethyl acetate, and washed with deionized water for washing. After the water layer was separated, the organic layer was washed twice with deionized water. The organic layer was heated up to a liquid temperature of 40 degrees C. under a reduced pressure to remove ethyl acetate, and thus-obtained residue was dissolved in 400 g of ethanol.

Then in a 3000 ml glass flask, 1400 g of ethanol, 700 g of pure water, and 50 g of 25% tetraethylammonium hydroxide were placed, and stirred. To this mixture was added dropwise the ethanol solution of the polymer at a liquid temperature of 40 degrees C. After that, the solution was stirred for 2 hours at 40 degrees C. After the reaction finished, the reaction was quenched by adding 35 g of acetic acid, and ethanol was removed under a reduced pressure. To thus-obtained solution was added 2000 ml of ethyl acetate, and a water layer was separated. An organic layer was washed twice with ultrapure water. To this contents was added 600 g of propylene glycol monomethyl ether (PGME), and the contents were heated up to a liquid temperature of 40 degrees C. under a reduced pressure to remove ethyl acetate and to give a PGME solution of a polymer.

The polymer was termed polymer 4. In order to measure the yield of the polymer 4, about 1 g of the polymer solution was weighed accurately, and subsequently dried in a drier at 150 degrees C. for 1 hour. Then the evaporation residue was weighed again, and the yield was 100% in relation to the theoretical value that all added monomers were hydrolyzed completely. As is evident from this result, all the monomers used in the reaction were converted into the polymer, and were hydrolyzed completely. And by calculating the added composition, it was found that the polymer had a silicon content of 36 mass %, and a carbon content of 25 mass %.

[Preparation of Silicone Resin Film Composition]

As shown in Table 1, each polymer represented by polymer 1 to 4, and an acid generator represented by AG 1 (see the following structural formula) were dissolved in an organic solvent containing 0.1 mass % of FC-430 (manufactured by Sumitomo 3M) according to ratios shown in Table 1, and this solution was filtered through a 0.1 μm fluororesin filter to prepare each solution of silicone resin film composition (Sol 1 to 4).

AG1

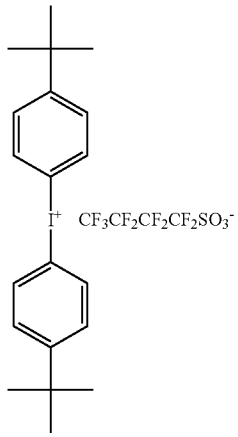

Each of the solution of silicone resin film composition was applied to a silicon substrate, and baked at 200 degrees C. for 60 seconds to form a silicone resin film 193 nm thick. Each silicone resin film was measured with incident light angle variable spectroscopic ellipsometer (VASE) manufactured by J.A. Woollam Co., Inc. to determine optical constant (refractive index indicated as n value, extinction coefficient indicated as k value) at a wavelength of 193 nm. The results are shown in Table 1.

TABLE 1

| Silicone Resin Film Composition | Silicone Resin (parts by mass) | Acid Generator (parts by mass) | Organic Solvent (parts by mass) | optical constant at a wavelength of 193 nm | |
|---|---|---|---|---|---|
| | | | | n value | k value |
| Sol 1 | polymer 1 (40) | AG1 (0.2) | PGMEA (1000) | 1.77 | 0.22 |
| Sol 2 | polymer 2 (40) | AG1 (0.2) | PGMEA (1000) | 1.76 | 0.15 |
| Sol 3 | polymer 3 (40) | AG1 (0.4) | PGMEA (1000) | 1.75 | 0.15 |
| Sol 4 | polymer 4 (40) | AG1 (0.4) | PGME (1000) | 1.74 | 0.15 |

[Tests of Dry Etching Resistance]

Then tests of dry etching resistance were conducted.

First, the silicone resin film compositions Sol 1 to 4 used for measuring above refractive index were used to form silicone resin films: Film 1 to 4, respectively. The Films were subjected to tests of dry etching resistance under etching conditions with $CHF_3/CF_4$ gas and under etching conditions with oxygen by using dry-etching-system TE-8500P manufactured by Tokyo Electron, Ltd.

The etching conditions are shown below.

Etching Conditions with $CHF_3/CF_4$ Gas

| Chamber Pressure | 40 Pa |
|---|---|
| RF Power | 1,300 W |
| Gap | 9 mm |
| $CHF_3$ Gas Flow Rate | 30 ml/min |
| $CF_4$ Gas Flow Rate | 30 ml/min |
| Ar Gas Flow Rate | 100 ml/min |
| Time | 30 sec |

Etching Conditions with Oxygen

| Chamber Pressure | 60 Pa |
|---|---|
| RF Power | 600 W |
| Gap | 9 mm |
| Ar Gas Flow Rate | 40 ml/min |
| $O_2$ Gas Flow Rate | 60 ml/min |
| Time | 30 sec |

Then the difference in a thickness of each silicone resin film before and after etching was determined. The results are shown in Table 2.

As is evident from Table 2, Film 3 and Film 4 exhibit excellent etching resistance against etching with oxygen, and particularly function as excellent etching masks when an underlying organic layer is etched.

TABLE 2

| Silicone Resin Film | $CHF_3/CF_4$ Gas Etching Rate (nm/min.) | $O_2$ Gas Etching Rate (nm/min.) |
|---|---|---|
| Film 1 | 140 | 17 |
| Film 2 | 160 | 6 |
| Film 3 | 250 | 1 |
| Film 4 | 270 | 1 |

Example 1

First, propylene glycol monomethyl ether acetate solution (28 parts by mass of a resin, and 100 parts by mass of a solvent) of 4,4'-(9H-fluorene-9-ylidene) bisphenol novolac resin (molecular weight: 11000) was spin-coated on a substrate, and was heated at 250 degrees C. for 1 minute to form an organic film with a thickness of 300 nm.

Second, Sol 4 prepared above was spin-coated on the organic film, and heated for 90 seconds at 220 degrees C. to form a lower silicone resin film with a thickness of 70 nm.

Third, Sol 1 prepared above was spin-coated on the lower silicone resin film, and heated for 90 seconds at 180 degrees C. to form an upper silicone resin film with a thickness of 10 nm.

In this way, an antireflection silicone resin film including the lower silicone resin film and the upper silicone resin film was formed.

Then a photoresist film composition with the following composition was spin-coated on the antireflection silicone resin film, and heated for 60 seconds at 120 degrees C. to form a photoresist film with a thickness of 250 nm.

The composition of the photoresist film composition is as follows.

Resin: 10 parts by mass of Polymer A (see the following structural formula)

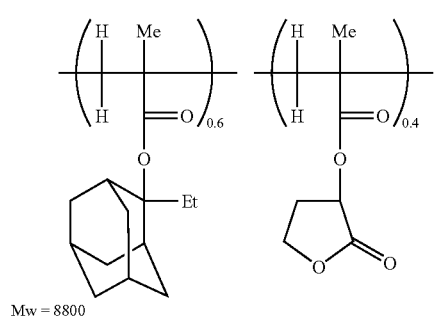

Polymer A

Mw = 8800

Photo Acid Generator: 0.2 parts by mass of triphenyl sulfonium nonafluoro butane sulfonate Basic Additive: 0.02 parts by mass of triethanolamine Solvent: 600 parts by mass of PGMEA (propylene glycol methyl ether acetate)

As described above, a substrate with an organic film, an antireflection silicone resin film on the organic film, and a photoresist film on the antireflection silicone resin film was prepared.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38% aqueous solution of tetra methyl ammonium hydroxide (TMAH), to obtain a 110 nm line and space pattern.

Observation of thus-obtained positive resist pattern revealed that there was no footing profile and so on, and that the pattern had vertical wall profile.

Next, the antireflection silicone resin film was etched under dry etching conditions in which the silicone resin film has sufficiently higher etching rate than organic compositions with using the resist pattern as an etching mask. A dry-etching-system TE-8500P manufactured by Tokyo Electron, Ltd. was used, and the etching conditions were as follows.

Chamber Pressure: 40 Pa

RF Power: 1,300 W

Gap: 9 mm $CHF_3$ Gas Flow Rate: 30 ml/min $CF_4$ Gas Flow Rate: 30 ml/min

Ar Gas Flow Rate: 100 ml/min

In this way, the antireflection silicone resin film was etched by the dry etching to form a pattern on the antireflection silicone resin film while pattern deformation due to side etching of the photoresist film hardly influenced the pattern.

After that, the substrate having the pattern-transferred silicone resin film was etched under dry etching conditions in which the underlying organic film has sufficiently higher etching rate than the silicone resin film. The etching was conducted by reactive dry etching with oxygen plasma, and the etching conditions were as follows.

Chamber Pressure: 60 Pa

RF Power: 600 W

Ar Gas Flow Rate: 40 sccm $O_2$ Gas Flow Rate: 60 sccm

Gap: 9 mm

By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection silicone resin film on the organic film was also etched and removed.

After that, the organic film remaining on the substrate was removed by oxygen gas plasma etching.

The pattern formed on the substrate was observed and it was confirmed that an excellent pattern was formed.

Example 2

A substrate was patterned as with Example 1 except that Sol 2 instead of Sol 1 was applied as the upper silicone resin film composition on the lower silicone resin film to form a 5 nm thick upper silicone resin film.

After a resist pattern was formed, obtained positive resist pattern was observed. As a result, the observation revealed that there was no footing profile and so on, and that the pattern had vertical wall profile.

After the substrate was patterned, the pattern formed on the substrate was observed and it was confirmed that an excellent pattern was formed.

Example 3

A substrate was patterned as with Example 1 except that Sol 3 instead of Sol 1 was applied as the upper silicone resin film composition on the lower silicone resin film to form a 5 nm thick upper silicone resin film.

After a resist pattern was formed, obtained positive resist pattern was observed. As a result, the observation revealed that the pattern had almost vertical wall profile. Incidentally, a little footing profile was observed in comparison with Examples 1 and 2.

After the substrate was patterned, the pattern formed on the substrate was observed and it was confirmed that an excellent pattern was formed.

Comparative Example 1

It was attempted to pattern a substrate as with Example 1 except that Sol 1 was applied on the organic film to form only one layer of 80 nm thick silicone resin film without forming bilayer of the lower silicone resin film and the upper silicone resin film.

However, when the underlying organic film was etched for pattern transfer with using the antireflection silicone resin film as an etching mask, the etching gas removed the silicone resin film completely while the organic film was etched because the silicone resin film had low etching resistance. Consequently, processing the organic film ended unfinished.

Comparative Example 2

It was attempted to pattern a substrate as with Example 1 except that Sol 4 was applied on the organic film to form 80 nm thick silicone resin film without forming bilayer of the lower silicone resin film and the upper silicone resin film.

After a resist pattern was formed on the photoresist film, thus-obtained positive pattern was observed. As a result, the observation revealed that the pattern had heavy footing profile. Therefore, it was found that such a photoresist film is not suitable for an etching mask.

Comparative Example 3

It was attempted to pattern a substrate as with Example 1 except that Sol 1 instead of Sol 4 was applied as the lower silicone resin film composition on the organic film to form 70 nm thick lower silicone resin film, and that Sol 4 instead of Sol 1 was applied as the upper silicone resin film composition on the lower silicone resin film to form 10 nm thick upper silicone resin film.

After a resist pattern was formed on the photoresist film, thus-obtained positive pattern was observed. As a result, the observation revealed that the pattern had heavy footing profile. Therefore, it was found that such a photoresist film is not suitable for an etching mask.

The present invention is not limited to the above-described embodiments. The above-described embodiments are mere examples, and those having the substantially same structure as that described in the appended claims and providing the similar action and advantages are included in the scope of the present invention.

What is claimed is:

1. A substrate comprising at least an organic film, an antireflection silicone resin film over the organic film, and a photoresist film over the antireflection silicone resin film, wherein the substrate comprises at least the organic film, the antireflection silicone resin film over the organic film, and the photoresist film over the antireflection silicone resin film, and wherein the antireflection silicone resin film between the organic film and the photoresist film includes a lower silicone resin film and an upper silicone resin film which is directly formed on the lower silicone resin film and has lower silicon content than the lower silicone resin film.

2. The substrate according to claim 1, wherein the lower silicone resin film has a silicon content of 30 mass % or more.

3. The substrate according to claim 2, wherein the lower silicone resin film has a carbon content of 29 mass % or less, and the upper silicone resin film has higher carbon content than the lower silicone resin film.

4. The substrate according to claim 3, wherein the upper silicone resin film has a silicon content of less than 35 mass %.

5. The substrate according to claim 2, wherein the upper silicone resin film has a silicon content of less than 35 mass %.

6. The substrate according to claim 1, wherein the lower silicone resin film has a carbon content of 29 mass % or less, and the upper silicone resin film has higher carbon content than the lower silicone resin film.

7. The substrate according to claim 6, wherein the upper silicone resin film has a silicon content of less than 35 mass %.

8. The substrate according to claim 1, wherein the upper silicone resin film has a silicon content of less than 35 mass %.

* * * * *